US009699908B2

(12) United States Patent
Baba et al.

(10) Patent No.: US 9,699,908 B2
(45) Date of Patent: Jul. 4, 2017

(54) COMPONENT-EMBEDDED BOARD AND COMMUNICATION TERMINAL DEVICE

(71) Applicant: Murata Manufacturing Co., Ltd., Kyoto (JP)

(72) Inventors: Takahiro Baba, Kyoto (JP); Yuki Wakabayashi, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 14/627,194

(22) Filed: Feb. 20, 2015

(65) Prior Publication Data
US 2015/0163918 A1 Jun. 11, 2015

Related U.S. Application Data

(63) Continuation of application No. PCT/JP2013/074654, filed on Sep. 13, 2013.

(30) Foreign Application Priority Data

Oct. 31, 2012 (JP) .................. 2012-239780

(51) Int. Cl.
H05K 1/18 (2006.01)
H01L 23/00 (2006.01)
H05K 3/46 (2006.01)
H05K 1/02 (2006.01)
H05K 1/03 (2006.01)

(52) U.S. Cl.
CPC .......... *H05K 1/183* (2013.01); *H01L 24/19* (2013.01); *H01L 24/20* (2013.01); *H05K 1/0298* (2013.01);
(Continued)

(58) Field of Classification Search
CPC ........ H05K 1/027; H05K 1/111–1/118; H05K 1/182–1/186; H05K 10/036; H05K 1/162; H01L 2924/01078
(Continued)

(56) References Cited

U.S. PATENT DOCUMENTS

2007/0263369 A1 11/2007 Takeuchi
2009/0188703 A1 7/2009 Ito
(Continued)

FOREIGN PATENT DOCUMENTS

JP 2007-305674 A 11/2007
JP 2010-258019 A 11/2010
(Continued)

OTHER PUBLICATIONS

Decision of Final Rejection issued in corresponding Japanese Patent Application No. 2014-544372 dated Sep. 8, 2015.
(Continued)

*Primary Examiner* — Tuan T Dinh
(74) *Attorney, Agent, or Firm* — Pearne & Gordon, LLP

(57) ABSTRACT

A component-embedded board includes a multilayer board obtained by stacking resin layers and an electronic component in the multilayer board having terminal electrodes on at least one principal face. The resin layers include a first resin layer having a space to accommodate the electronic component and at least one first interlayer connector formed by solidifying a conductive paste outside each of at least three sides of a principal face of the electronic component and a second resin layer having second and third interlayer connectors formed by solidifying a conductive paste. At least one second interlayer connector is positioned outside the three sides of the principal face. The third interlayer connectors are joined to the terminal electrodes. The first resin layer and the second resin layer are adjacent to each other in a stacking direction within the multilayer board. The first interlayer connector and the second interlayer connector are joined.

20 Claims, 15 Drawing Sheets

(52) U.S. Cl.
CPC ........... *H05K 1/0326* (2013.01); *H05K 1/181* (2013.01); *H05K 1/186* (2013.01); *H05K 3/4617* (2013.01); *H01L 2224/0401* (2013.01); *H01L 2224/04105* (2013.01); *H01L 2224/16225* (2013.01); *H01L 2224/73267* (2013.01); *H01L 2924/12042* (2013.01); *H01L 2924/1531* (2013.01); *H01L 2924/19105* (2013.01); *H05K 1/0243* (2013.01); *H05K 2201/0141* (2013.01); *H05K 2201/096* (2013.01); *H05K 2201/09527* (2013.01); *H05K 2203/0278* (2013.01); *H05K 2203/063* (2013.01)

(58) Field of Classification Search
USPC .......... 174/259–268; 361/763–766, 792–795
See application file for complete search history.

(56) References Cited

U.S. PATENT DOCUMENTS

2011/0244636 A1* 10/2011 Kondo .............. H01L 23/49822
438/127

2012/0188734 A1* 7/2012 Mikado .................. H05K 1/185
361/761

FOREIGN PATENT DOCUMENTS

| JP | 2011-222553 | A  | 11/2011 |
|----|-------------|----|---------|
| JP | 2012-015239 | A  | 1/2012  |
| WO | 2009/093343 | A1 | 7/2009  |
| WO | 2012/046829 | A1 | 4/2012  |
| WO | 2012/111711 | A1 | 8/2012  |
| WO | 2012/117872 | A1 | 9/2012  |

OTHER PUBLICATIONS

International Search Report issued in Application No. PCT/JP2013/074654 dated Oct. 8, 2013.
Written Opinion issued in Application No. PCT/JP2013/074654 dated Oct. 8, 2013.
Notification of Reason for Rejection issued in corresponding Japanese Patent Application No. 2014-544372 dated Jun. 2, 2015.

* cited by examiner

FIG. 1
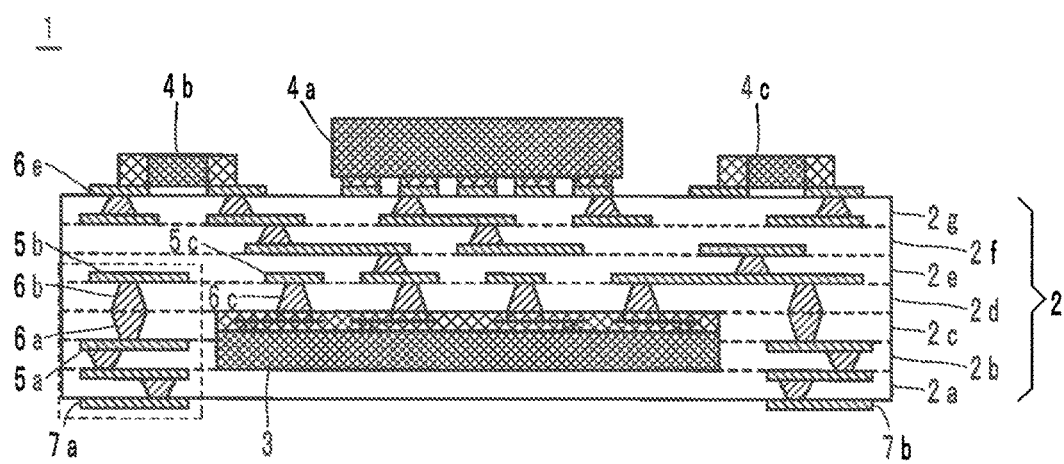
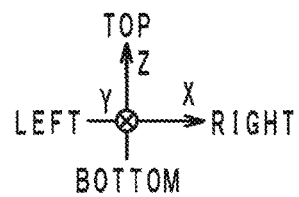

FIG.5C
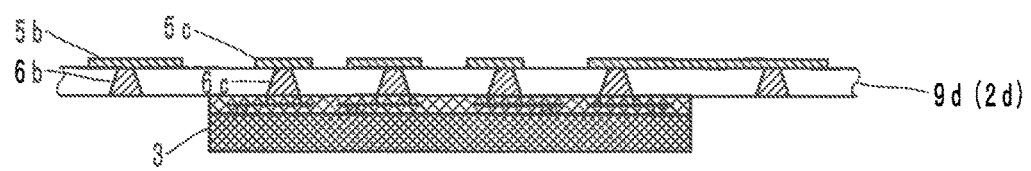
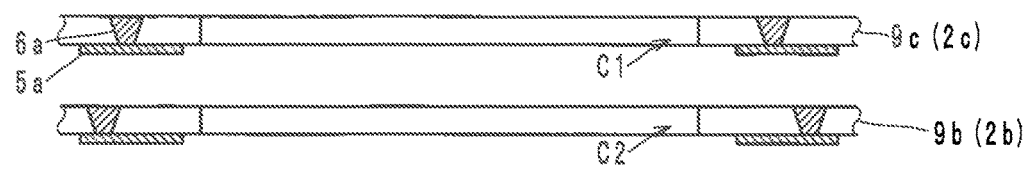
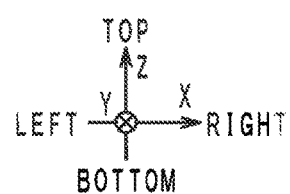

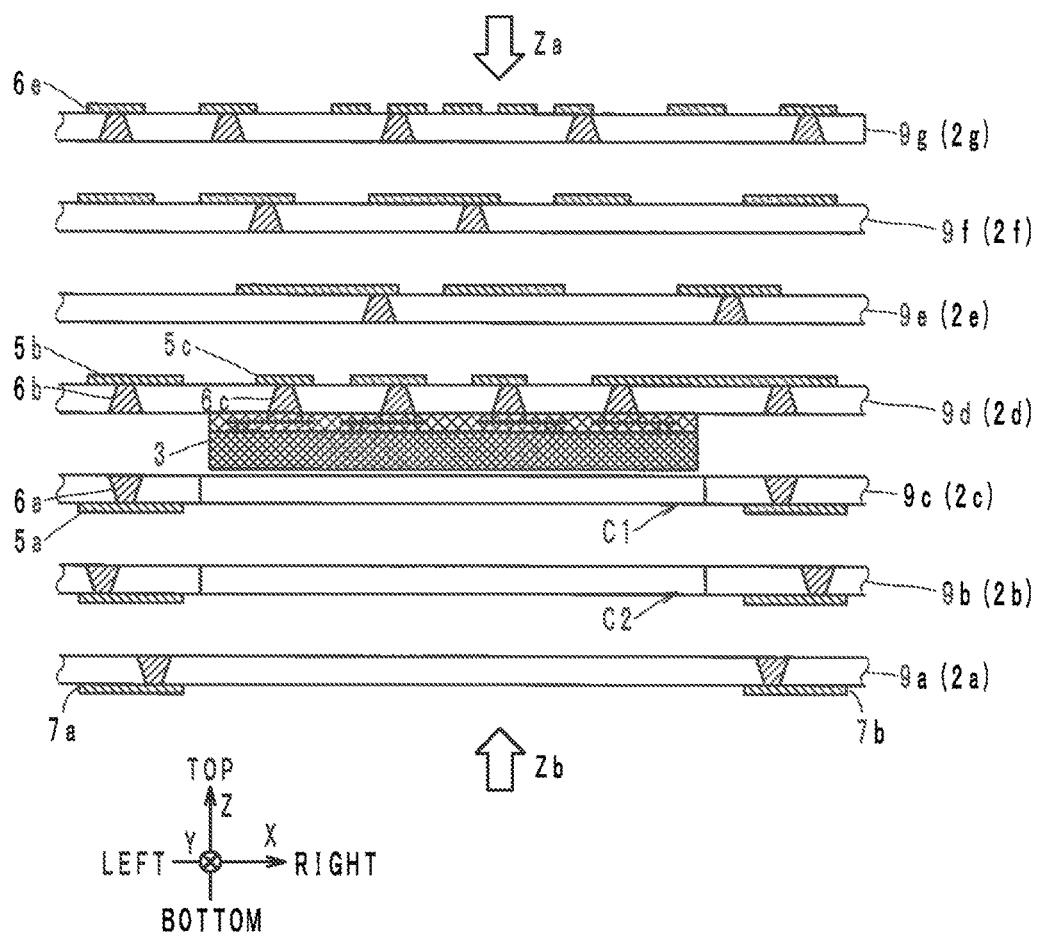

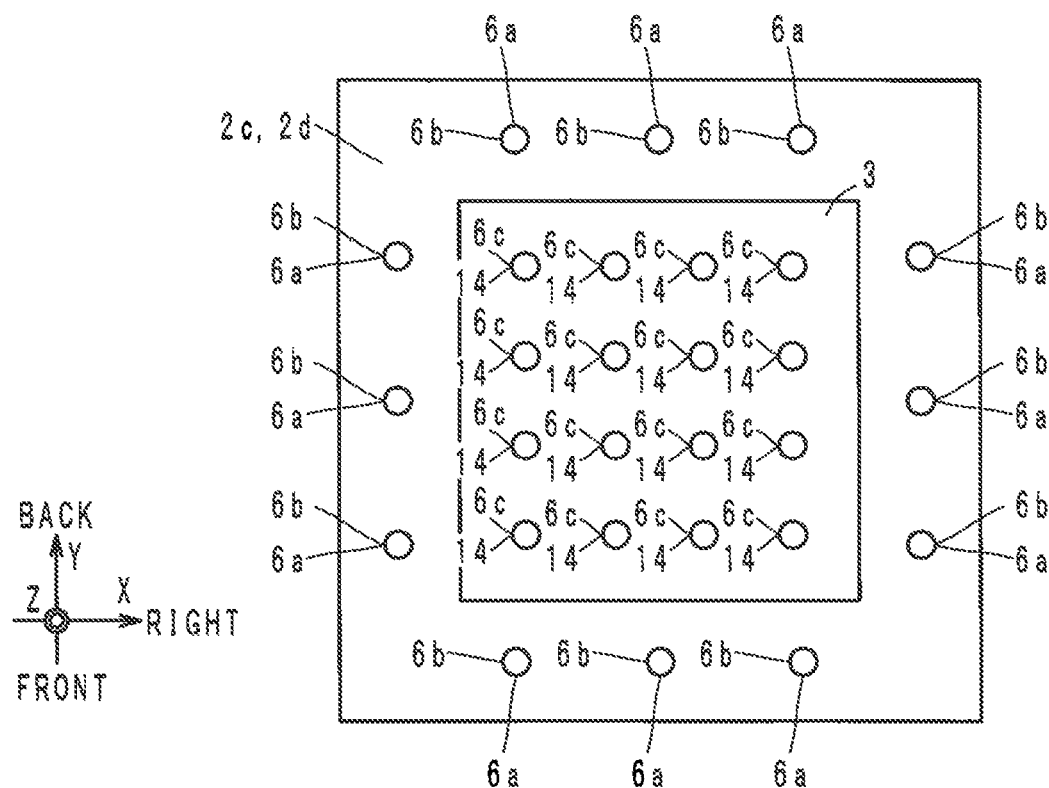

F I G. 1 0
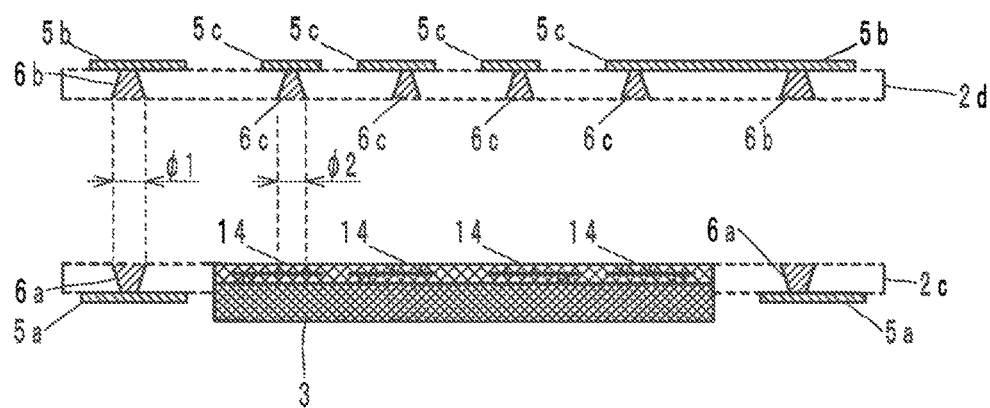
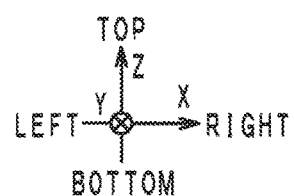

F I G . 1 2
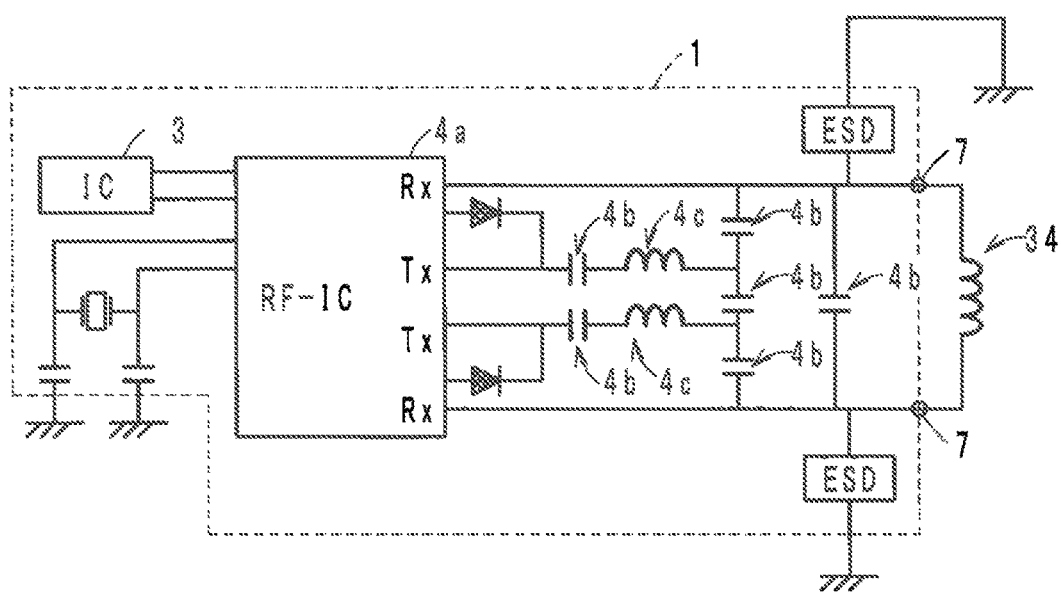

COMPONENT-EMBEDDED BOARD AND COMMUNICATION TERMINAL DEVICE

This application is based on Japanese Patent Application No. 2012-239780 filed on Oct. 31, 2012, and International Application No. PCT/JP2013/074654 filed on Sep. 12, 2013, the entire content of each of which is incorporated herein by reference.

BACKGROUND OF THE INVENTION

1. Field of the Invention

The present invention relates to a component-embedded board in which an electronic component is provided in a multilayer board, and the invention also relates to a communication terminal device including the same.

2. Description of the Related Art

An example of a conventional component-embedded board is described in Japanese Laid-Open Patent Publication No. 2011-222553. In this component-embedded board, an electronic component (semiconductor chip), which has stud bumps provided on electrodes on a first surface, and a thermosetting resin film (first layer), which has pads formed thereon, are disposed such that the stud bumps are opposite to the pads with a thermoplastic resin film (second layer) positioned therebetween. Here, the pads and the stud bumps as well as the electrodes and the stud bumps are joined by a pressing and heating process.

Furthermore, provided on the second layer is a thermosetting film (third layer) with a hollow portion formed to accommodate the electronic component. The electronic component has another group of electrodes for wiring or thermal radiation provided on a second surface on the opposite side to the first surface. Provided on the third layer is a thermoplastic resin film (fourth layer) in which interlayer connectors are formed and joined to the group of electrodes provided on the second surface of the semiconductor chip.

In the component-embedded board, interlayer connectors formed in the first layer are electrically connected to interlayer connectors formed in the second layer via pattern conductors. Likewise, interlayer connectors of the third layer are electrically connected to interlayer connectors of the fourth layer via pattern conductors.

On the other hand, the interlayer connectors of the second and third layers are directly bonded to each other without any pattern conductors being interposed there between. Here, the second layer is provided with at least one interlayer connector outside each of two opposing sides of the first surface (or the second surface) of the semiconductor chip. The interlayer connectors of the third layer, when viewed in a plan view in the direction of stacking from the first layer to the fourth layer, are provided in the same positions as the interlayer connectors of the second layer.

As described above, the interlayer connectors of the second and third layers are simply provided outside two opposing sides of the electronic component. Accordingly, when the layers are pressed in the stacking direction at the time of the pressing and heating process, the interlayer connectors of the second and third layers might be misaligned from each other.

SUMMARY OF THE INVENTION

One aspect of the present invention is directed to a component-embedded board including a multilayer board and an electronic component. The multilayer board is obtained by stacking a plurality of resin layers. The electronic component is provided in the multilayer board and has a plurality of terminal electrodes on at least one principal face.

The resin layers at least include a first resin layer and a second resin layer. The first resin layer has a space formed to accommodate the electronic component and is provided with at least one first interlayer connector outside each of at least three sides of a principal face of the electronic component. The first interlayer connector is formed by solidifying a conductive paste. The second resin layer at least has second and third interlayer connectors, each being formed by solidifying a conductive paste such that at least one second interlayer connector is positioned outside each of the at least three sides of the principal face, and the third interlayer connectors are joined directly to the terminal electrodes.

The first resin layer and the second resin layer are adjacent to each other in a stacking direction within the multilayer board. The first interlayer connector and the second interlayer connector are joined directly to each other.

Another aspect of the present invention is directed to a communication terminal device including the component-embedded board.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1 is a vertical cross-sectional view of a component-embedded board according to an embodiment of the present invention.

FIG. 5C is a schematic diagram illustrating a step subsequent to the step of FIG. 5B.

FIG. 5D is a schematic diagram illustrating a step subsequent to the step of FIG. 5C.

FIG. 6 is a top view of the interface between the first and second resin layers in FIG. 1.

FIG. 10 is a schematic diagram illustrating the relationship between diameters $\phi 1$ and $\phi 2$ in FIG. 1 where $\phi 1$ is the diameter of the surface of a second interlayer connector that is joined to a first interlayer connector, and φ2 is the diameter of the surface of a third interlayer connector that is joined to the electronic component.

FIG. 12 is a schematic diagram illustrating an equivalent circuit for essential parts of the communication terminal device in FIG. 11.

DETAILED DESCRIPTION OF THE PREFERRED EMBODIMENTS

First, X-, Y-, and Z-axes shown in some figures will be described. The X-, Y-, and Z-axes are perpendicular to one another. The Z-axis represents a stacking direction of resin layers. For the sake of convenience, the positive side of the Z-axis is defined as the top side of a component-embedded board. Moreover, the X-axis indicates the left to right direction. For the sake of convenience, the positive side of the X-axis is defined as the right side of the component-embedded board. Furthermore, the Y-axis indicates the front to back direction. For the sake of convenience, the positive side of the Y-axis is defined as the back side of the component-embedded board.

Figure 3A:
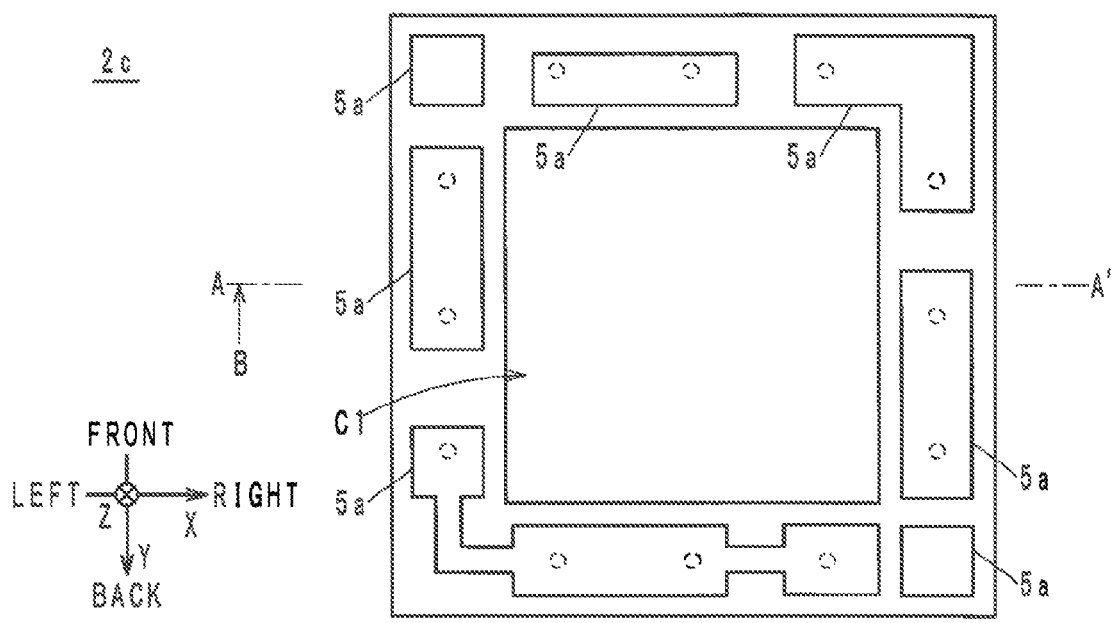
FIG. 3A is a bottom view of a first resin layer in FIG. 1.
Figure 3B:
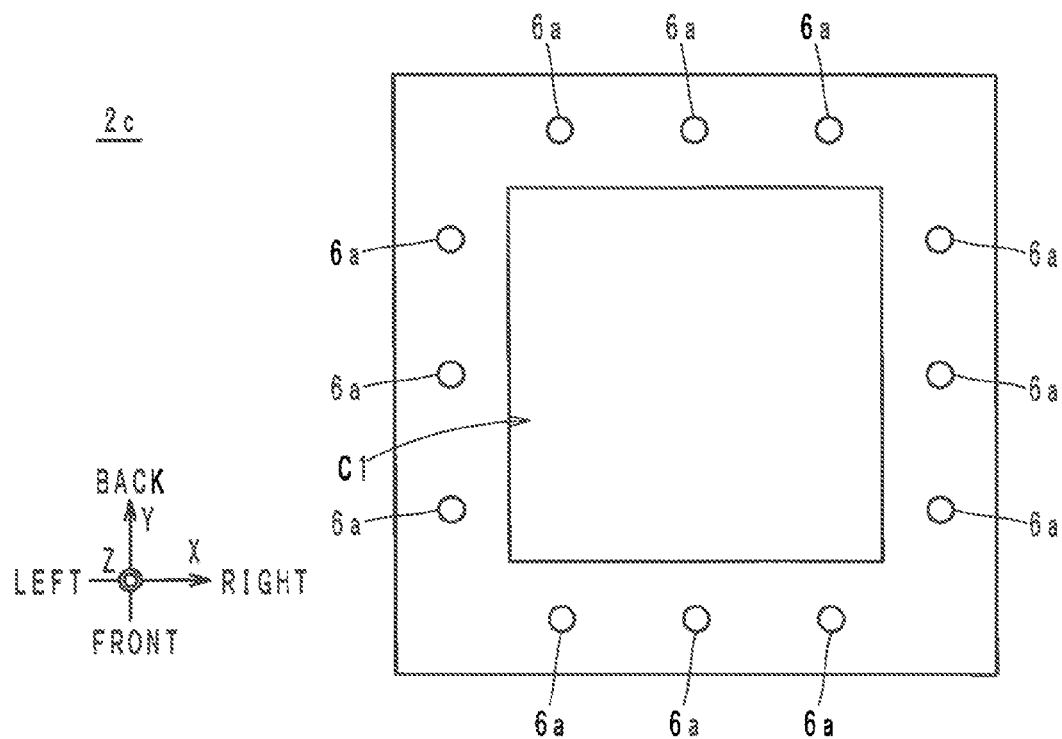
FIG. 3B is a top view of the first resin layer in FIG. 1.
Figure 4A:
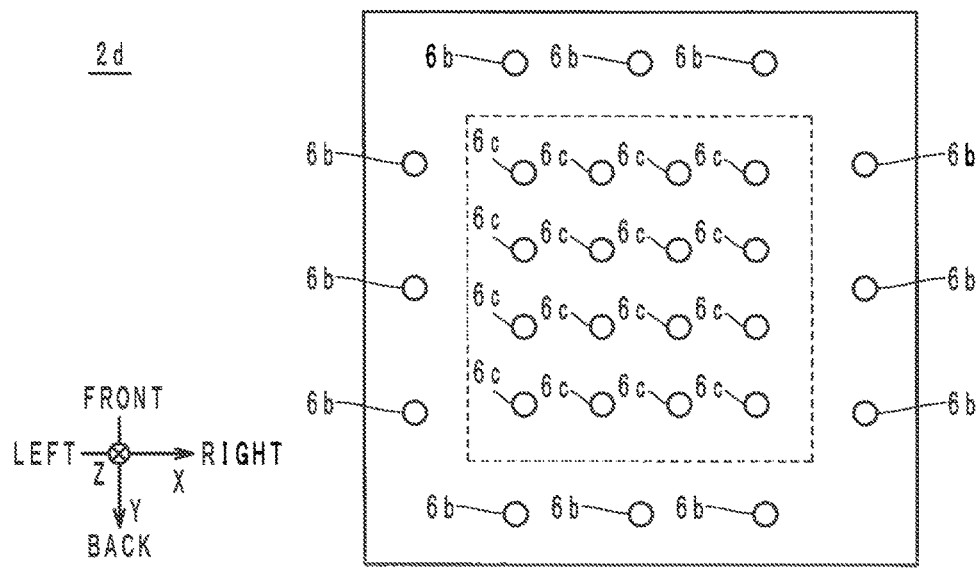
FIG. 4A is a top view of a second resin layer in FIG. 1.
Figure 4B:
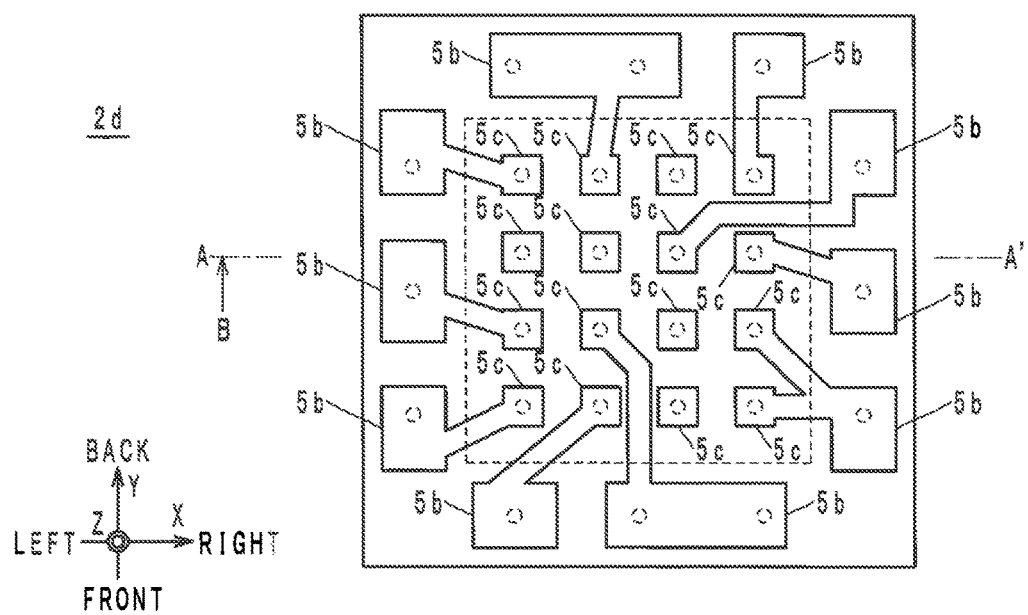
FIG. 4B is a bottom view of the second resin layer in FIG. 1.

Hereinafter, the configuration of a component-embedded board (completed product) according to an embodiment of the present invention will be described with reference to FIGS. 1 to 4B. FIG. 1 is a cross-section taken along line A-A' as shown in FIG. 3A or 4B and viewed in the direction of arrow B. The component-embedded board 1 includes a multilayer board 2, at least one internal electronic component 3, a surface-mount electronic component 4, a plurality of pattern conductors 5, a plurality of interlayer connectors 6, and a plurality of external electrodes 7.

The multilayer board 2 is a stack of resin layers. FIG. 1 shows an example of the resin layers, including a first resin layer 2c and a second resin layer 2d, as well as a third resin layer 2a, a fourth resin layer 2b, a fifth resin layer 2e, a sixth resin layer 2f, and a seventh resin layer 2g. The resin layers 2a to 2f are made of a flexible material having electrical insulation properties. An example of such a material is a thermoplastic resin. Typical examples of the thermoplastic resin include liquid crystal polymer and polyimide. Liquid crystal polymer is preferable as a material of the resin layers because of its superior high-frequency characteristics and low water absorption.

The resin layers 2a to 2g have the same rectangular shape when they are viewed in a top view. The thickness of each of the resin layers 2a to 2g in the stacking direction Z is from about 10 micrometers [μm] to about 100 μm. The resin layer 2a is the bottom layer. The resin layer 2b is provided on top of the resin layer 2a. Similarly, the resin layers 2c to 2g are provided on top of their corresponding resin layers 2b to 2f. Note that in FIG. 1, the border between every two adjacent resin layers in the stacking direction Z is indicated by an imaginary dotted line.

The electronic component 3 is provided in the multilayer board 2. FIG. 1 shows a CSP (Chip Size Package) semiconductor component (referred to below as an IC chip) as a first example of the electronic component 3. Examples of such an IC chip include an RF IC chip and an image processing IC chip for a digital camera.

The electronic component 3 has a plurality of input/output terminal electrodes provided on at least one principal face (in the example in FIG. 1, the top face). More specifically, each input/output terminal electrode includes a pad electrode 12 provided on a main part 11 of the IC chip and a post electrode 14 exposed from the surface of a rewiring layer 13, as shown within a dotted circle in FIG. 2, and the electrodes 12 and 14 are electrically connected. Here, at least the post electrode 14 is made of copper.

In one configuration, the surface-mount electronic component 4 is mounted on the top face of the multilayer board 2 included in the component-embedded board 1. The electronic component 4 may be an IC chip as described above or may be a passive component such as a capacitor or a resistor.

The pattern conductors 5 are indicated by left-to-right downward diagonal hatching in the figures. The pattern conductors 5 are formed with a conductive material, such as copper, as a part of the wiring of an electronic circuit, including the electronic components 3 and 4, within the multilayer board 2. More specifically, the pattern conductors 5 are strip-like or elongated conductors formed on the top or bottom faces of the resin layers 2b to 2g.

Note that in FIG. 1, from the viewpoint of clarity of the figure, not all pattern conductors are denoted by reference characters, and only three of them are denoted by the reference characters "5a", "5b", and "5c", respectively. The pattern conductor 5a is formed on the bottom face of the resin layer 2c, and the pattern conductors 5b and 5c are formed on the top face of the resin layer 2d. The positions in which the pattern conductors 5a to 5c are formed will be described in more detail below.

As is explicitly shown in FIG. 3A, there are a plurality of pattern conductors 5a provided around a space C1 in which the electronic component 3 is accommodated. Here, the space C1 has a rectangular shape when viewed in a plan view in the stacking direction Z. Most of the pattern conductors 5a are in contact with and joined to the bottom end of at least one interlayer connector 6a (to be described later).

As is explicitly shown in FIG. 4B, there are a plurality of pattern conductors 5b provided around the space C1 (indicated by dotted lines) when viewed in a plan view in the stacking direction Z. The pattern conductors 5b are in contact with and joined to the top end of at least one interlayer connector 6b (to be described later).

The pattern conductors 5c are provided in the center of the resin layer 2d, more specifically, in positions corresponding to the input/output terminal electrodes of the electronic component 3. The pattern conductors 5c are in contact with and joined to the top ends of interlayer connectors 6c (to be described later). Moreover, most of the pattern conductors 5c are each connected to one of the pattern conductors 5b positioned nearby.

Note that in the present embodiment, at least the pattern conductors 5a to 5c are wiring patterns used for signal transmission. In FIG. 1, other pattern conductors without reference characters are shown as wiring patterns. However, these other pattern conductors may be pattern conductors for forming a capacitor, a coil, or the like.

The interlayer connectors 6 are indicated by right-to-left downward diagonal hatching in the figures. The interlayer connectors 6 are typically made of a conductive material, such as a metal mainly composed of tin or silver or an alloy thereof. As with the pattern conductors 5, the interlayer connectors 6 constitute a part of the wiring of the electronic circuit, and vertically pierce through the resin layers 2a to 2f in predetermined positions.

Note that in FIG. 1, from the viewpoint of clarity of the figure, not all interlayer connectors 6 are denoted by reference characters, and three essential types of interlayer connectors are denoted by the reference characters "6a", "6b", and "6c", respectively. The first interlayer connector 6a is provided in the resin layer 2c, and the second interlayer connectors 6b and third interlayer connectors 6c are provided in the resin layer 2d. The positions in which the interlayer connectors 6a to 6c are formed will be described in more detail below.

The first interlayer connectors 6a are interposed between the pattern conductors 5a and the second interlayer connectors 6b in the resin layer 2d provided directly thereabove when viewed in a top view from above the component-embedded board 1, so that the pattern conductors 5a and the second interlayer connectors 6b are electrically connected. In addition, as is explicitly shown in FIG. 3B, the resin layer 2c is provided with at least one first interlayer connector 6a outside each of four sides of the rectangular space C1. In other words, at least one first interlayer connector 6a is provided between one side of the space C1 and one side of the resin layer 2c that is close and parallel thereto. The same applies to the remaining three sides of the space C1. Note that in the example in FIG. 3B, three first interlayer connectors 6a are provided outside each side of the space C1.

The second interlayer connectors 6b are interposed between the pattern conductors 5b and the second interlayer connectors 6a in the resin layer 2c provided directly therebelow when viewed in a top view. More specifically, the second interlayer connectors 6b are joined directly to their corresponding first interlayer connectors 6a. As a result, the second interlayer connectors 6b electrically connect the pattern conductors 5b and the first interlayer connectors 6a. Moreover, the second interlayer connectors 6b are positioned so as to overlap with the corresponding first interlayer connectors 6a when viewed in a top view. That is, as is explicitly shown in FIG. 4A, the resin layer 2c is provided with at least one second interlayer connector 6b outside each of four sides of the rectangular space C1 (indicated by dotted lines). Note that in the example in FIG. 4A, three second interlayer connectors 6b are provided outside each side of the space C1.

The third interlayer connectors 6c are provided in the center of the resin layer 2d, more specifically, in positions corresponding to the pattern conductors 5c. The third interlayer connectors 6c are joined directly to their corresponding pattern conductors 5c as well as their corresponding input/output terminal electrodes of the electronic component 3, so that the pattern conductors 5c and the input/output terminal electrodes are electrically connected.

Here, the interlayer connectors 6a to 6c preferably increase in diameter toward the interface between the resin layers 2c and 2d. As a result, the contact area between the interlayer connectors 6a and 6b and the contact area between the interlayer connector 6c and the input/output terminal of the electronic component 3 can be maximized. Moreover, the interlayer connectors 6a and 6b are preferably shaped so as to be approximately symmetrical to each other with respect to the interface between the resin layers 2c and 2d. As a result of the foregoing, the reliability of the connections between the electronic component 3 and the third interlayer connectors 6c is enhanced.

Furthermore, as described above, the second interlayer connectors 6b are joined directly to the corresponding interlayer connectors 6a. The interlayer connectors 6c are joined directly to the corresponding input/output terminal electrodes of the electronic component 3. In other words, there are no pattern conductors either between the interlayer connectors 6a and 6b or between the interlayer connectors 6c and the input/output terminals. Therefore, it is possible to improve the flatness of the surface of the multilayer board 2.

Moreover, the external electrodes 7 are made of, for example, the same conductive material as the pattern conductors, and provided on the bottom face of the resin layer 2a in order to mount the component-embedded board 1 on another circuit board. As the external electrodes 7, FIG. 1 shows the external electrodes 7a and 7b, which are electrically connected to the pattern conductors 5 provided on the bottom face of the resin layer 2b by their corresponding interlayer connectors 6.

Next, a non-limiting example of the method for producing the component-embedded board 1 will be described with reference to FIGS. 5A to 5D. In the following, the process of producing one component-embedded board 1 will be described, but in actuality, large-sized resin layers are stacked and cut, thereby producing a large number of component-embedded boards 1 at the same time.

Figure 5A:
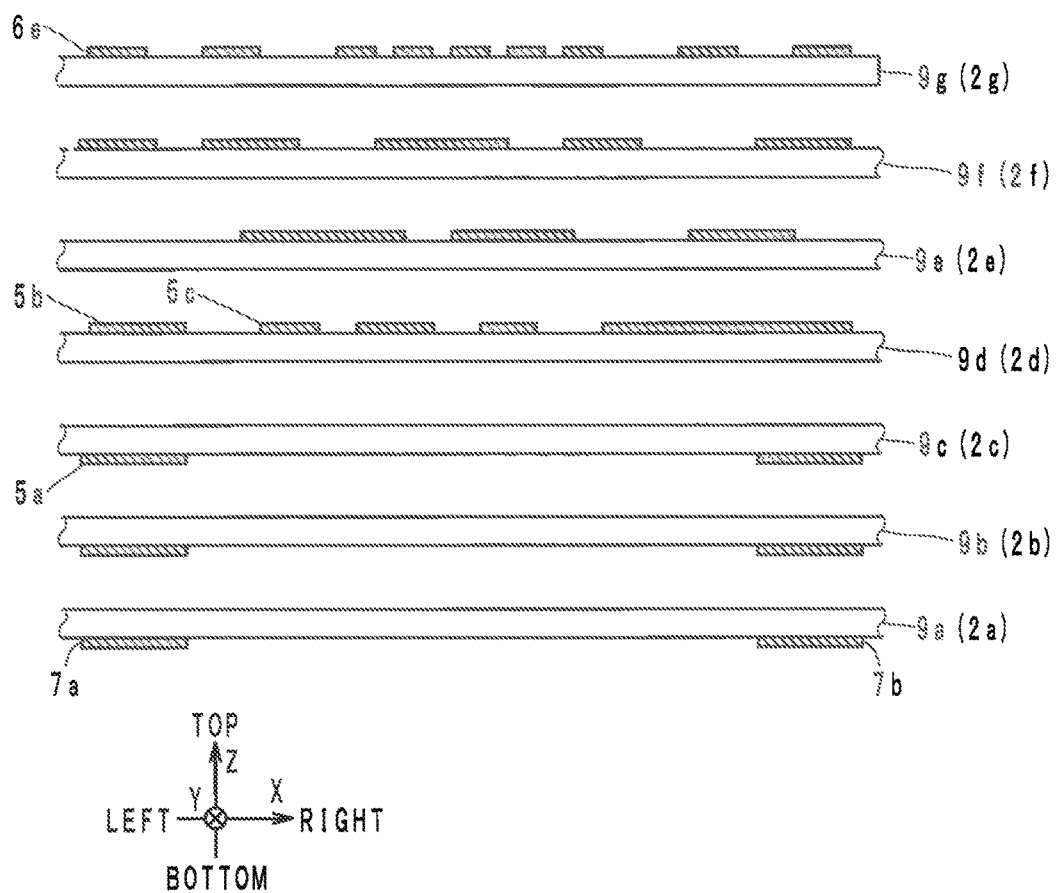
FIG. 5A is a schematic diagram illustrating the first step of a method for producing the component-embedded board in FIG. 1.

Prepared first are a necessary number of large-sized resin layers with their top surfaces copper-foiled almost entirely. The large-sized resin layers serve as resin layers 2a to 2g upon completion of a component-embedded board 1. Accordingly, large-sized resin layers 9a to 9g corresponding to the resin layers 2a to 2g are prepared, as shown in FIG. 5A. As described earlier, the resin layers 9a to 9g are preferably sheets of liquid crystal polymer, each having a thickness of, for example, from 10 μm to 100 μm. The thickness of the copper foil is, for example, from 10 μm to 20 μm. Note that the copper-foiled surfaces are preferably smoothened, for example, by galvanization for rust prevention.

Next, as shown in FIG. 5A, a plurality of external electrodes 7 (including external electrodes 7a and 7b) are formed on one surface (i.e., the bottom surface) of the resin layer 9a by photolithography. More specifically, resists are printed on the copper foil of the resin layer 9a in the same shapes as the external terminals 7. Then, any portions of the copper foil that are not coated with the resists are removed by etching the copper foil. Thereafter, the resists are removed. In this manner, the external terminals 7 are formed on the bottom surface of the resin layer 9a.

Furthermore, pattern conductors 5a are similarly formed on one surface (i.e., the bottom surface) of each of the resin layers 9b and 9c by photolithography, as shown in FIG. 5A.

In addition, at least pattern conductors 5b and 5c are similarly formed on one surface (i.e., the top surface) of the resin layer 9d by photolithography, as shown in FIG. 5A. The positions in which the pattern conductors 5a to 5c are formed have already been described earlier.

In addition, pattern conductors 5 are similarly formed on one surface (i.e., the top surface) of each of the resin layers 9e to 9g by photolithography, as shown in FIG. 5A.

Figure 5B:
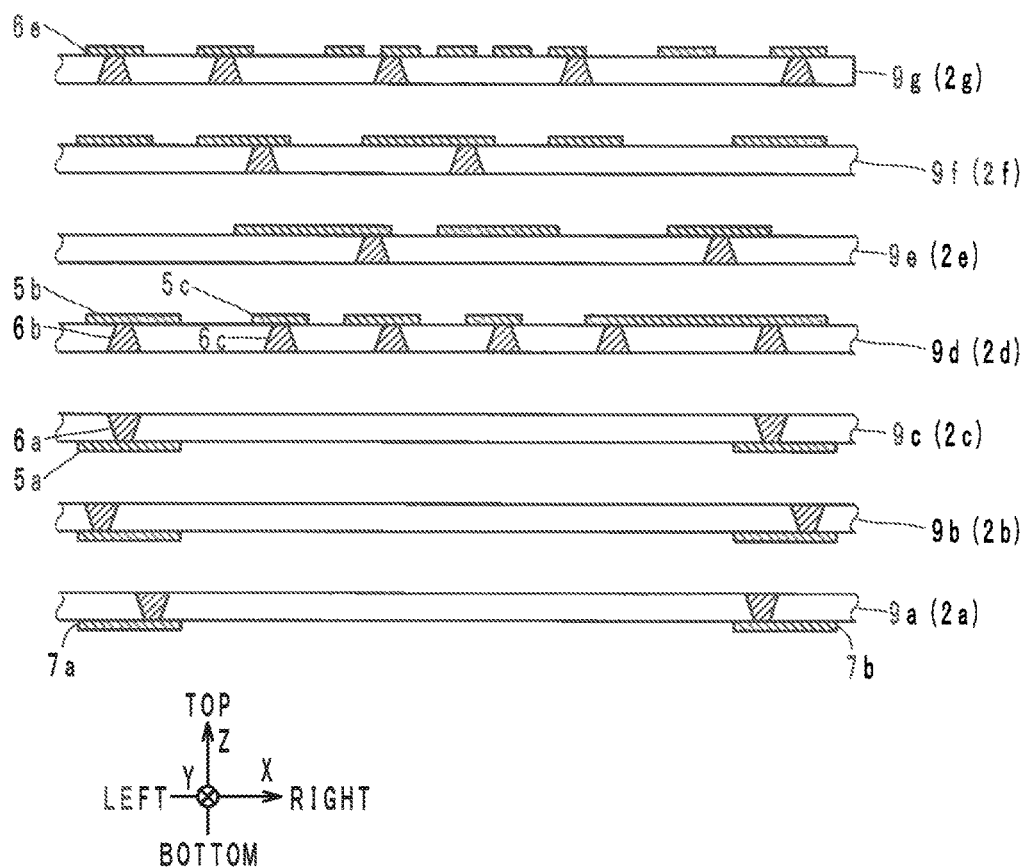
FIG. 5B is a schematic diagram illustrating a step subsequent to the step of FIG. 5A.
Figure 7A:
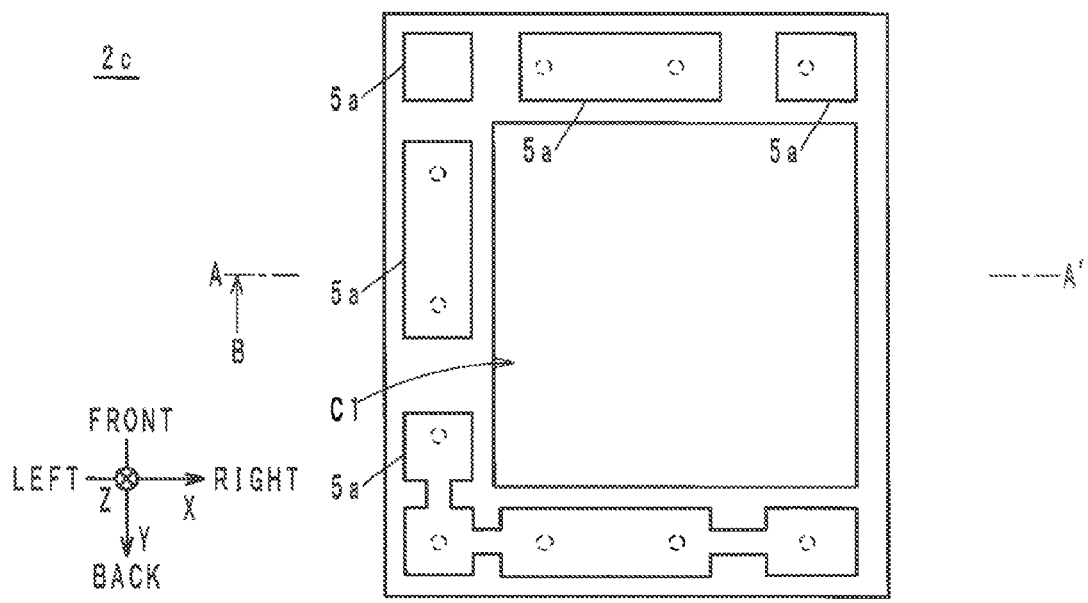
FIG. 7A is a bottom view of a first resin layer according to a modification of the embodiment of FIG. 1.
Figure 7B:
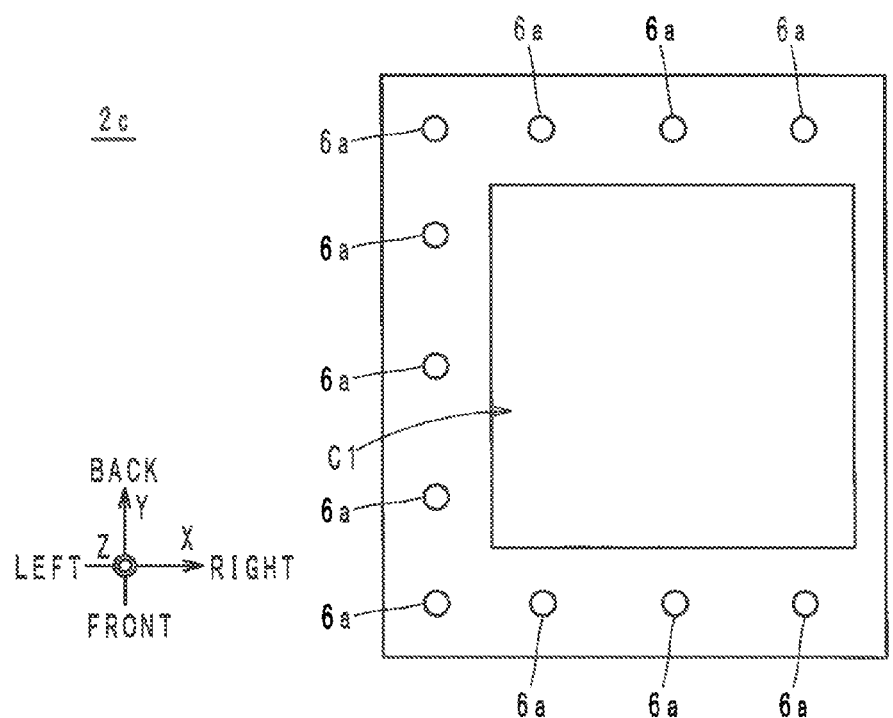
FIG. 7B is a top view of the first resin layer according to the modification.
Figure 8A:
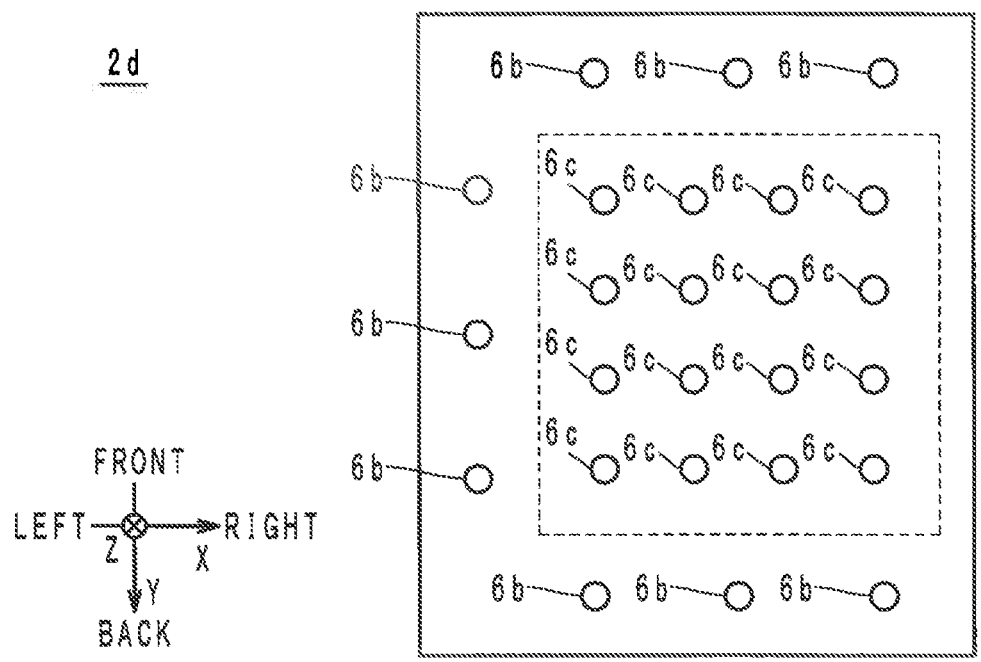
FIG. 8A is a top view of a second resin layer according to the modification.
Figure 8B:
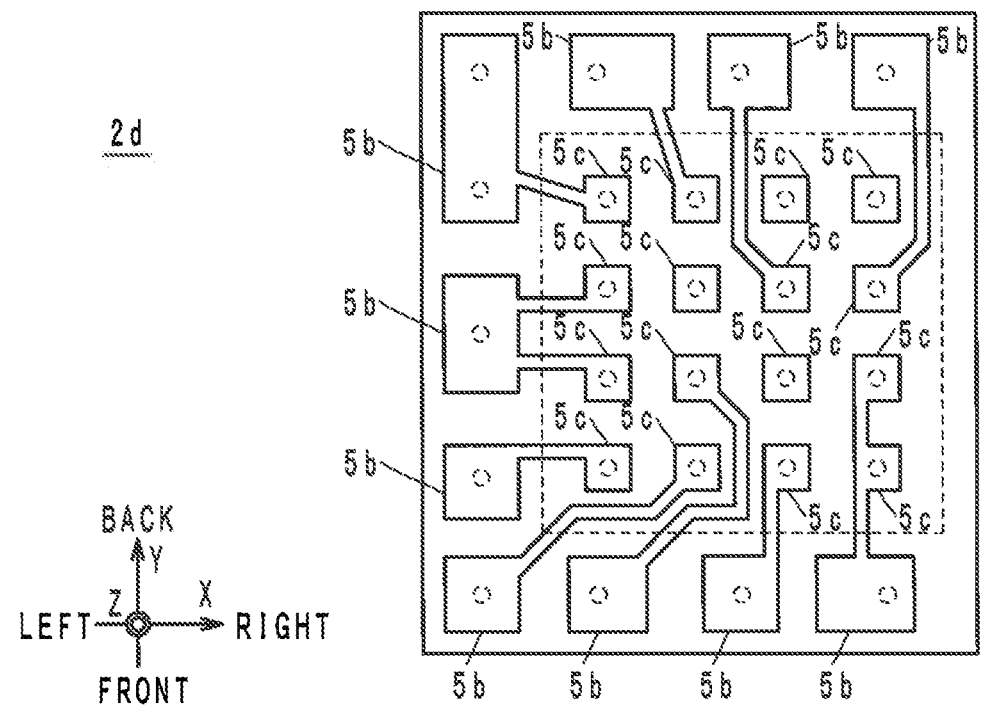
FIG. 8B is a bottom view of the second resin layer according to the modification.

Next, the resin layer 9a is irradiated with laser beams in positions where interlayer connectors 6 (indicated by left-to-right downward diagonal hatching) are to be formed, as shown in FIG. 5B, on the other surface (i.e., the surface without the external electrodes 7). As a result, through-holes are provided, and thereafter, each of the through-holes is filled with a conductive paste. The conductive paste is made from, for example, a metal mainly composed of tin or silver or an alloy thereof and is thermosetting and viscous.

Through-holes are also provided in the resin layers 9b to 9g, as in the resin layer 9a, and thereafter, each of the through-holes is filled with the aforementioned conductive paste. In particular, the resin layer 9c is irradiated with laser beams in positions where interlayer connectors 6a are to be formed on the other surface (i.e., the surface without the pattern conductors 5a). Each of the resultant through-holes is filled with the conductive paste as described above.

Further, in particular, the resin layer 9d is irradiated with laser beams in positions where interlayer connectors 6b and 6c are to be formed on the other surface (i.e., the surface without the pattern conductors 5b and 5c). Each of the resultant through-holes is filled with the conductive paste as described above. The positions in which the interlayer connectors 6a to 6c are formed have already been described earlier.

Next, an electronic component 3 is mounted in a predetermined position on the other surface (i.e., the bottom surface) of the resin layer 9d as shown in FIG. 5C. More specifically, the electronic component 3 is placed such that its input/output terminal electrodes are positioned at the bottom ends of their corresponding interlayer connectors 6.

Furthermore, to make room for accommodating the electronic component 3, portions of the resin layers 9b and 9c are punched out using a punching die. As a result, spaces C1 and C2 are provided in the resin layers 9c and 9b, respectively. The spaces C1 and C2, when viewed in a top view, are slightly larger than the outline of the electronic component 3.

Next, the resin layers 9a to 9g are stacked in this order from bottom to top, as shown in FIG. 5D. Here, the resin layer 9a having the external electrodes 7 formed thereon is placed such that the surface with the external electrodes 7 faces down. The resin layers 9b and 9c are stacked such that the surfaces with the pattern conductors 5 face down. The remaining resin layers 9d to 9f are stacked such that the surfaces with the pattern conductors 5 face up.

Thereafter, the stacked resin layers 9a to 9f are heated and pressed from both the top and bottom sides (as indicated by arrows Za and Zb). The heating and the pressing soften and bond the resin layers 9a to 9f, thereby integrating them. At the same time, the conductive paste in each through-hole is solidified so that interlayer connectors 6 are formed.

Here, as described above, the conductive paste in each through-hole is mainly composed of tin or silver, and the input/output terminal electrodes of the electronic component 3 (in particular, the post electrodes 14) are made of copper. Accordingly, the conductive pastes and the post electrodes 14 are combined into alloys (Sn—Cu alloys) at the joints therebetween during the pressing and heating process, resulting in enhanced mechanical strength of the joints.

After the pressing and heating process, a plurality of surface-mount components 4 are mounted on the integrated resin layers 9a to 9g, and then, the integrated resin layers 9a to 9g are cut into a predetermined size. As a result, a component-embedded board 1 in which an electronic circuit including the electronic component 3 and the surface-mount electronic components 4 is provided in a multilayer board 2 is completed (see FIG. 1).

During the pressing and heating process, the resin layers 9a to 9g are fluidized. In particular, for example, the fluidized resin layer 9d flows into the space C2, so that the spaces C1 and C2 are filled with resin. If there is any pattern conductor interposed between the resin layers 9c and 9d around the electronic component 3, the fluidized resin layer 9d might be prevented from flowing into the space C2. As a result, it might become impossible to ensure satisfactory joints between the interlayer connectors 6c and the input/output terminal electrodes of the electronic component 3. In view of this background, the interlayer connectors 6b are directly joined to their corresponding interlayer connectors 6a without other pattern conductors intervening, thereby ensuring satisfactory resin fluidity.

However, if the pattern conductors are omitted as such, the interlayer connectors 6a and 6b might be likely to be misaligned from each other during the pressing and heating process. In addition, due to differences in coefficient of thermal expansion and contraction behavior among the resin layers 9a to 9g, the pattern conductors 5, and the interlayer connectors 6, the joints between the electronic component 3 and the interlayer connectors 6c are stressed during the pressing and heating process, which might result in reduced reliability of their connections.

Therefore, the interlayer connectors 6a and 6b are provided in the resin layer 2c such that at least one of each is positioned outside each of four sides of the rectangular space C1 (i.e., the electronic component 3) when viewed in a top view, as shown in FIG. 6. Moreover, at the start of the pressing and heating process, the interlayer connectors 6a and 6b are still in the form of conductive pastes with viscosity. The viscosity of the interlayer connectors 6a and 6b provided in such a manner as to surround the periphery of the electronic component 3 prevents deformation of the resin layers which otherwise might occur during the pressing and heating process (e.g., the resin layer 9d is prevented from warping away from the resin layer 9c). Moreover, even if the resin layers 9c and 9d are stressed in any directions during the pressing and heating process, the viscosity of the interlayer connectors 6a and 6b provided so as to surround the periphery of the electronic component 3 produces an alignment effect and also absorbs the stresses, whereby misalignment between the resin layers 9c and 9d and also between the interlayer connectors 6a and 6b can be prevented.

Furthermore, there are a plurality of sets of interlayer connectors 6 disposed vertically beside the electronic component 3, as shown within the dotted rectangle in FIG. 1. At least two sets of such interlayer connectors 6 are preferably provided in different positions when viewed in a top view. As a result, the flatness of the top and bottom surfaces of the multilayer board 2 can be enhanced.

Modification

The above embodiment has been described with respect to the example where the interlayer connectors 6a and 6b are provided outside the four sides of the space C1 (i.e., the electronic component 3) when viewed in a top view, as shown in FIGS. 3A to 4B. However, this is not limiting, and the interlayer connectors 6a and 6b may be provided outside three of the sides of the space C1 (i.e., the electronic component 3) when viewed in a top view, as shown in FIGS. 7A to 8B.

The above embodiment has been described with respect to the example where the spaces C1 and C2 are formed during the production process. However, this is not limiting, and the component-embedded board 1 may be produced without forming the spaces C1 and C2.

Figure 2:
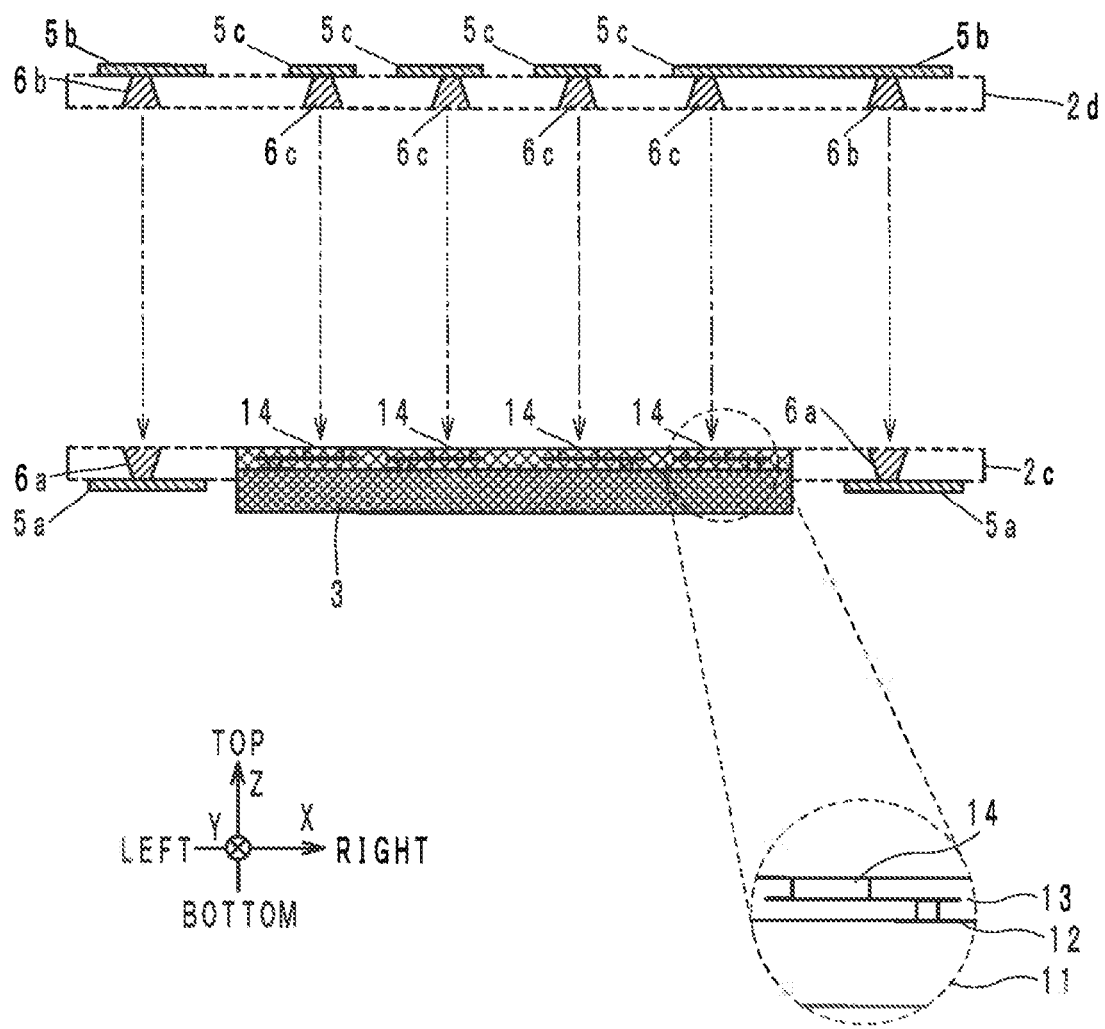
FIG. 2 is an exploded view illustrating in vertical cross-section essential parts of the component-embedded board in FIG. 1.
Figure 9:
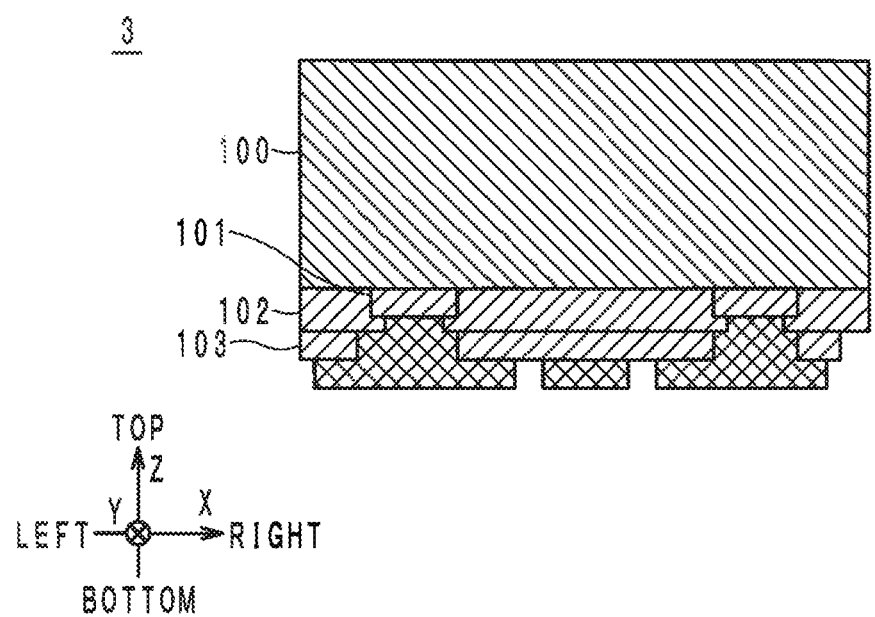
FIG. 9 is a schematic diagram illustrating another configuration example of an internal electronic component in FIG. 1.

The above embodiment has been described with respect to the example where the electronic component 3 includes the rewiring layer 13 provided on the main part 11 of the IC chip, as shown in FIG. 2. However, this is not limiting, and the electronic component 3 may be structured as shown in FIG. 9. Specifically, under-bump metals (UBMs) 101 are formed on an Si substrate 100 and covered with an $SiO_2$ layer 102. A polyimide layer 103 is formed on the $SiO_2$ layer 102. Input/output terminal electrodes made of copper or suchlike are formed on the polyimide layer 103.

In the above embodiment and its modification, a plurality of interlayer connectors 6a and 6b are provided for each of three or four sides of the space C1 (i.e., the electronic component 3) when viewed in a plan view, but the effects as mentioned above can be achieved so long as at least one from each of the interlayer connectors 6a and 6b is provided for each side. However, it is preferable that a plurality of interlayer connectors 6a and 6b be provided for each side, as in the embodiment and the modification, because misalignment between the resin layers 9c and 9d and also between the interlayer connectors 6a and 6b can be prevented reliably. Most preferably, the interlayer connectors 6a and 6b are provided so as to surround the space C1 (i.e., the electronic component 3) when viewed in a plan view.

Further, the electronic component 3 may be a passive component such as a capacitor or a resistor. Such a passive component has terminal electrodes provided at opposite ends so as to partially cover its two principal faces positioned on opposite sides in the stacking direction Z.

The interlayer connector 6b has a diameter $\phi 1$ at the surface joined to the interlayer connector 6a, and the interlayer connector 6c has a diameter $\phi 2$ at the surface joined to the input/output terminal electrode of the electronic component 3. FIG. 1 shows the case where the diameter $\phi 1$ is approximately equal to the diameter $\phi 2$. However, this is not limiting, and the diameters $\phi 1$ and $\phi 2$ may be designed such that $\phi 1 > \phi 2$, as shown in FIG. 10.

Incidentally, in recent years, IC chips (such as the electronic component 3) are becoming more compact and increasingly multifunctional. To deal with such a trend, it is necessary to decrease the diameter of the input/output terminal electrode. However, decreasing the diameter of the input/output terminal electrode sacrifices connection reliability. Therefore, to deal with such an issue, the aforementioned diameters $\phi 1$ and $\phi 2$ are designed such that $\phi 1 > \phi 2$. In addition, by designing the diameters such that $\phi 1 > \phi 2$, it is rendered possible to protect the joints between the interlayer connectors 6c and the input/output terminal electrodes of the IC chip against impacts on the multilayer board 2 from surroundings.

Figure 11:
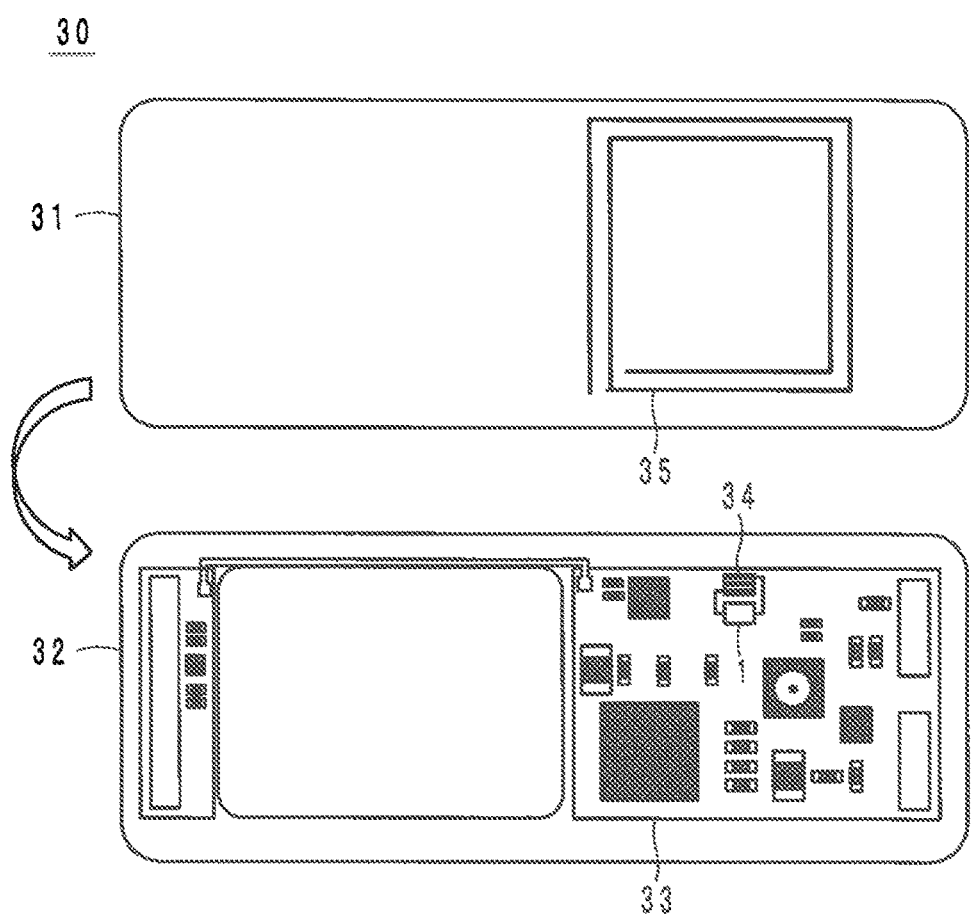
FIG. 11 is a schematic diagram illustrating the configuration of a communication terminal device using the component-embedded board in FIG. 1.

The component-embedded board 1 according to the above embodiment is used in, for example, a communication terminal device 30 with a 13.56-MHz band RF ID (Radio Frequency Identification) antenna module, as shown in FIG. 11. Examples of such an RF ID system include NFC (Near Field Communication) and FeliCa (registered trademark). FIG. 11 shows various components and members disposed in a housing 32 of the communication terminal device 30 with its housing cover 31 open. The communication terminal device 30 is typically a cell phone or a smartphone, and includes, for example, a printed-wiring board 33, a coil antenna 34, and a booster antenna 35, as well as the component-embedded board 1. Note that in addition to these, a battery pack, a camera, a UHF antenna, and various circuit elements are mounted and arranged in high density within the housing 32, but they are not indispensable features to the present invention, and therefore, any descriptions thereof will be omitted.

The coil antenna 34 is mounted on the printed-wiring board 33, along with the component-embedded board 1. Moreover, the coil antenna 34 is connected at opposite ends to external electrodes 7 of the component-embedded board 1, as shown in an equivalent circuit diagram in FIG. 12.

Furthermore, the booster antenna 35 is attached to the housing cover 31 so as to face the coil antenna 34 when the housing cover 31 is closed. The booster antenna 35 is, for example, a planar spiral coil or suchlike, and is provided in order to extend the communication distance of the coil antenna 34.

Aside from the foregoing, memory with encryption function as well as capacitor and inductor elements can be integrated with the component-embedded board 1 as electronic components 3. Accordingly, it is possible to reduce transmission loss and unnecessary electromagnetic coupling due to long wiring in the communication terminal device 30. Further, it is possible to downsize the space in which to mount the components.

In the example described above, the component-embedded board 1 is applied to the 13.56-MHz band RFID system, but the component-embedded board 1 can also be applied to wireless communication systems using the UHF band, such as a wireless LAN.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A component-embedded board, comprising:
   a multilayer board obtained by stacking a plurality of resin layers; and
   an electronic component provided in the multilayer board and having a plurality of terminal electrodes on at least one principal face, wherein,
   the resin layers at least include:
      a first resin layer having a space formed to accommodate the electronic component and being provided with at least one first interlayer connector outside each of at least three sides of a principal face of the electronic component, the first interlayer connector being formed by solidifying a conductive paste; and
      a second resin layer at least with second and third interlayer connectors, each being formed by solidifying a conductive paste such that at least one second interlayer connector is positioned outside each of the at least three sides of the principal face, and the third interlayer connectors are joined directly to the terminal electrodes,
   the first resin layer and the second resin layer are adjacent to each other in a stacking direction within the multilayer board,
   the first interlayer connector and the second interlayer connector are joined directly to each other,
   a material of the first interlayer connector, a material of the second interlayer connector, and a material of the third interlayer connector are the same, and
   the first interlayer connector and the second interlayer connector increase in diameter toward an interface between the first resin layer and the second resin layer.

2. The component-embedded board according to claim 1, wherein the third interlayer connector has a smaller diameter at a surface of the third interlayer connector joined to one of the terminal electrodes than a diameter of the first interlayer connector at a surface of the first interlayer connector joined to the second interlayer connector.

3. The component-embedded board according to claim 1, wherein the first interlayer connector, the second interlayer connector, and the third interlayer connector are electrically continuous to one another.

4. The component-embedded board according to claim 1, wherein both the first and second interlayer connectors are provided in plurality outside each of the three sides.

5. The component-embedded board according to claim 1, wherein both the first and second interlayer connectors are provided in plurality outside each of four sides of a principal face of the electronic component so as to surround the principal face when viewed in a plan view in a normal direction to the principal face.

6. The component-embedded board according to claim 1, wherein alloy layers are formed at joints between the terminal electrodes and the third interlayer connectors during production.

7. The component-embedded board according to claim 1, wherein the first interlayer connector and the second interlayer connector are shaped so as to be approximately symmetrical to each other with respect to the interface between the first resin layer and the second resin layer.

8. The component-embedded board according to claim 1, wherein another electronic component is mounted on a surface of the multilayer board.

9. The component-embedded board according to claim 1, wherein the resin layers are made of a thermoplastic material.

10. A communication terminal device comprising a component-embedded board of claim 1.

11. The component-embedded board according to claim 1, wherein no pattern conductor is provided between the first interlayer connector and the second interlayer connector or between the third interlayer connectors and the plurality of terminal electrodes.

12. The component-embedded board according to claim 1, wherein the first interlayer connector and the second interlayer connector are connected not via any pattern conductors.

13. The component-embedded board according to claim 2, wherein both the first and second interlayer connectors are provided in plurality outside each of the three sides.

14. The component-embedded board according to claim 2, wherein both the first and second interlayer connectors are provided in plurality outside each of four sides of a principal face of the electronic component so as to surround the principal face when viewed in a plan view in a normal direction to the principal face.

15. The component-embedded board according to claim 3, wherein the second interlayer connector and the third interlayer connector are connected via only one pattern conductor.

16. The component-embedded board according to claim 3, wherein both the first and second interlayer connectors are provided in plurality outside each of the three sides.

17. The component-embedded board according to claim 3, wherein both the first and second interlayer connectors are provided in plurality outside each of four sides of a principal face of the electronic component so as to surround the principal face when viewed in a plan view in a normal direction to the principal face.

18. The component-embedded board according to claim 4, wherein both the first and second interlayer connectors are provided in plurality outside each of four sides of a principal face of the electronic component so as to surround the principal face when viewed in a plan view in a normal direction to the principal face.

19. The component-embedded board according to claim 15, wherein both the first and second interlayer connectors are provided in plurality outside each of the three sides.

20. The component-embedded board according to claim 15, wherein both the first and second interlayer connectors are provided in plurality outside each of four sides of a principal face of the electronic component so as to surround the principal face when viewed in a plan view in a normal direction to the principal face.

* * * * *

UNITED STATES PATENT AND TRADEMARK OFFICE
CERTIFICATE OF CORRECTION

PATENT NO. : 9,699,908 B2
APPLICATION NO. : 14/627194
DATED : July 4, 2017
INVENTOR(S) : Takahiro Baba et al.

Page 1 of 1

It is certified that error appears in the above-identified patent and that said Letters Patent is hereby corrected as shown below:

On the Title Page

At item (63) please replace "Sep. 13, 2013" with --Sep. 12, 2013--

Signed and Sealed this
Fifth Day of December, 2017

Joseph Matal
*Performing the Functions and Duties of the*
*Under Secretary of Commerce for Intellectual Property and*
*Director of the United States Patent and Trademark Office*